United States Patent [19]

Shushurin

[11] Patent Number: 5,470,795
[45] Date of Patent: Nov. 28, 1995

[54] METHOD OF CONNECTING TERMINALS OF A PLASTIC-ENCAPSULATED POWER TRANSISTOR TO A PRINTED-CIRCUIT BOARD

[76] Inventor: Vladimir V. Shushurin, 3015 Brighton 13th St., Suite 3J, Brooklyn, N.Y. 11235

[21] Appl. No.: 201,657

[22] Filed: Feb. 25, 1994

[51] Int. Cl.⁶ .......................... H01L 21/48; H01L 21/58; H01L 21/603; H05K 7/20
[52] U.S. Cl. .......................... 437/208; 437/216; 361/731; 361/740; 361/732; 361/764; 361/783; 361/809; 439/810
[58] Field of Search .................... 361/731, 732, 361/740, 747, 809, 820, 783, 764, 770, 767, 807, 808; 439/810, 811, 812, 814; 437/208, 915, 216

[56] References Cited

U.S. PATENT DOCUMENTS

| | | | |
|---|---|---|---|
| 3,181,113 | 4/1965 | Esser | 439/814 |
| 3,344,394 | 9/1967 | Kingsbury et al. | 339/272 |
| 3,452,317 | 6/1969 | Carlson et al. | 439/816 |
| 3,737,839 | 6/1973 | Marechal | 339/272 R |
| 3,836,941 | 9/1974 | Izraeli | 439/810 |
| 3,864,005 | 2/1975 | Klein | 339/272 R |
| 3,883,207 | 5/1975 | Tomkiewicz | 339/75 M |
| 4,346,512 | 8/1982 | Liang et al. | 29/571 |
| 4,529,261 | 7/1985 | Stenz et al. | 339/272 R |
| 4,693,531 | 9/1987 | Raphal et al. | 439/312 |
| 4,725,182 | 2/1988 | Sakamoto et al. | 414/331 |
| 4,914,812 | 4/1990 | Webster | 29/831 |
| 4,924,213 | 5/1990 | Decho et al. | 340/653 |
| 4,990,108 | 2/1991 | Sakaguchi | 439/678 |
| 5,109,318 | 4/1992 | Funari et al. | 361/388 |
| 5,118,458 | 6/1992 | Nishihara et al. | 264/155 |
| 5,119,272 | 6/1992 | Ohyama et al. | 361/402 |
| 5,191,512 | 3/1993 | Ogura et al. | 361/386 |

FOREIGN PATENT DOCUMENTS

| | | | |
|---|---|---|---|
| 2352415 | 5/1974 | Germany | 339/810 |
| 61-4285 | 1/1986 | Japan | 361/783 |
| 1753523 | 8/1992 | U.S.S.R. | 439/810 |

OTHER PUBLICATIONS (Anonymous), "Keystone Electronics Corp. Catalog 985," Keystone Electronics Corp.: Astoria, N.Y. (1992), pp. 17–22 and front & back cover pages.
(Anonymous), "Connector Corporation (brochure)," Connector Corporation: Chicago, Ill. (1990), 2 pp.
(Anonymous), "Concord Design Engineers' Handbook and Purchasing Guide Cat. #2000-B," Concord Electronics Corporation: New York, N.Y. (1990), pp. 150–153 and front & back cover pages.

Primary Examiner—Olik Chaudhuri
Assistant Examiner—David E. Graybill
Attorney, Agent, or Firm—Charles E. Bruzga

[57] ABSTRACT

Disclosed is a method of connecting the terminals of at least one heat-sinked, plastic-encapsulated power transistor to circuits of a printed-circuit board. In the method, a main flat surface of the plastic-encapsulated power transistor is adhered to a first side of a heat sink. The transistor has a plurality of terminals projecting from one end of a transistor body in an orientation generally parallel to the main flat surface of the transistor. On a printed-circuit board, a mechanical coupling device is mounted that has respective conductors with respective, terminal-receiving apertures, for receiving the terminals of the transistor. The conductors are connected to respective circuits of the printed-circuit board. The printed-circuit board is adapted to be located on the mentioned one side of the heat sink in an assembled position. The heat sink, with the transistor mounted thereon, is positioned such that the terminals are respectively inserted into respective apertures in the mechanical coupling device. In any order, (i) the heat sink is affixed to a support member positioned in fixed relation to the printed-circuit board; and (ii) the terminals are mechanically secured in the apertures of the mechanical coupling device, and, in doing so, the respective tensioning devices are moved from a non-pressing, to a sufficiently pressing, relation against the terminals that so-pressed portions of the terminals become substantially deformed in a manner that lowers ohmic contact resistance between the terminals and the conductors of the mechanical coupling means.

18 Claims, 5 Drawing Sheets

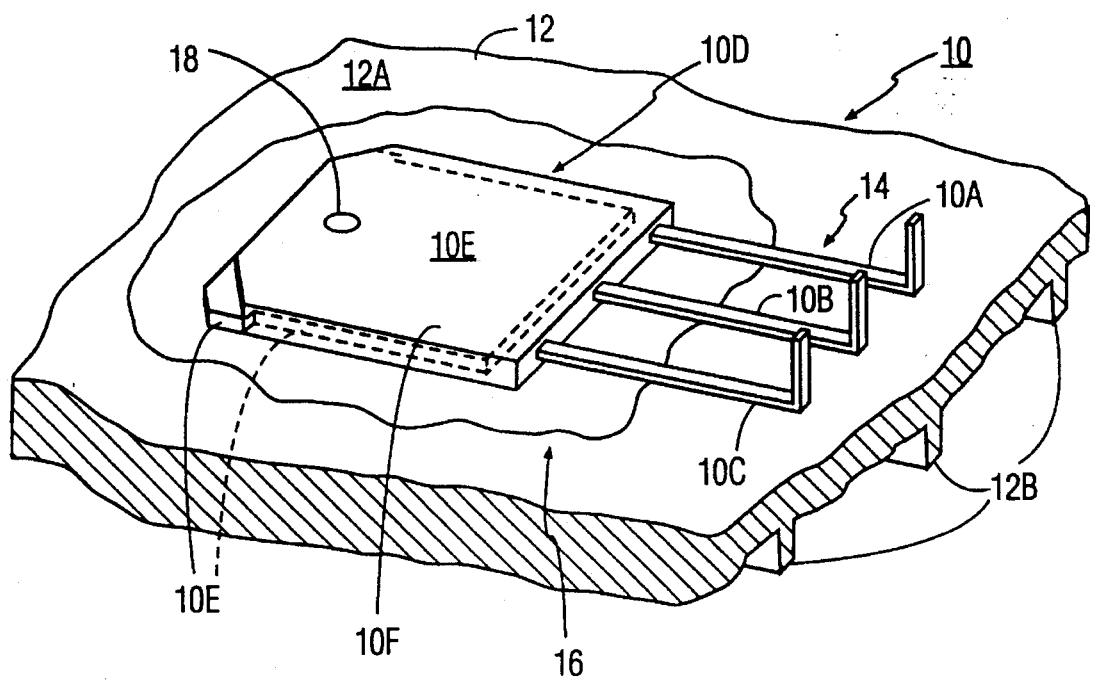
FIG. 1A
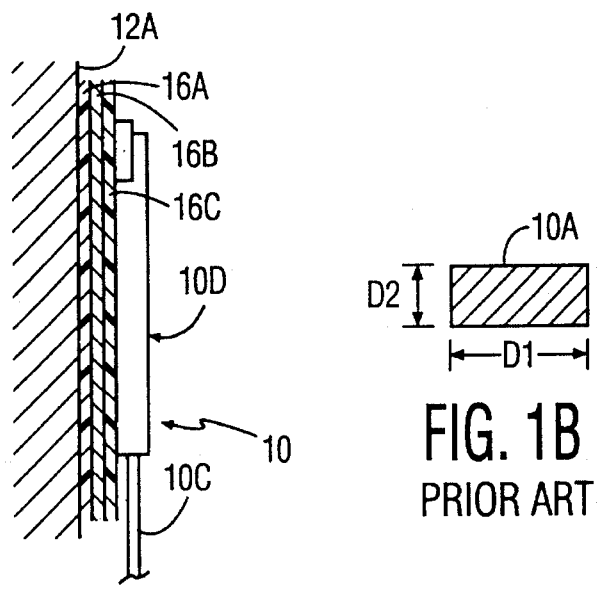
FIG. 1B
PRIOR ART
FIG. 1C

METHOD OF CONNECTING TERMINALS OF A PLASTIC-ENCAPSULATED POWER TRANSISTOR TO A PRINTED-CIRCUIT BOARD

FIELD OF THE INVENTION

The present invention relates to a method of connecting the terminals of plastic-encapsulated power transistors to respective circuits of a printed-circuit board. More particularly, it relates to a method of connecting the terminals of at least one heat-sinked, plastic-encapsulated power transistor to respective circuits of a printed-circuit board.

BACKGROUND OF THE INVENTION

Plastic-encapsulated power transistors typically comprise a generally thin transistor body with three terminals extending from the body. The transistor body contains an active semiconductor transistor element, and is encapsulated with plastic material. A metal substrate of high thermal conductivity is typically incorporated into the transistor body, and may either be exposed, or encapsulated within the plastic material. The three terminals typically comprise a pair of main current-carrying terminals and a control terminal; for a bipolar transistor, by way of example, the main-current carrying terminals comprise the emitter and collector terminals of the transistor, and the control terminal comprises a base terminal of the transistor. The three terminals typically extend from one end of the plastic-encapsulated transistor body in an orientation generally parallel to a main flat surface of the transistor body. The cross sections of the terminals along their length are typically rectangular, with the ratio of the longer, to the shorter, cross-sectional dimension being about 2 to 1.

Electronic equipment, such as power amplifiers, employ printed-circuit boards on which the majority of electrical connections among different electrical components are made. For assembling efficiency, at least the majority of electrical components are positioned on a top surface of a printed-circuit board (PCB), with respective, conductive "legs" extending substantially all the way through respective apertures in the printed-circuit board. A single, soldering operation is then typically performed using, for instance, the so-called technique of "wave" soldering in which the PCB is placed over a vat of solder in which a wave of solder is created and moved across the lower surface of the PCB. In this procedure, the downwardly protruding conductive legs of the various electrical components on the PCB are simultaneously soldered in place at the lower surface of the PCB. Such simultaneous soldering step is then typically followed by a simultaneous cleaning step, which may employ ultrasonic energy, for simultaneously removing solder from unwanted locations on the lower surface of the PCB.

Where a power transistor is attached to a heat sink, for removing heat from the transistor, the combination of heat sink and transistor is typically quite bulky. This has prevented the "heat-sinked" transistor from being positioned on the PCB with its terminals extending through apertures in the PCB and being soldered to the PCB in the above-described, simultaneous soldering operation. Thus, the prior art has led to a cumbersome procedure in which the PCB is first attached to a chassis, and then the terminals of the heat-sinked transistor are inserted through apertures in the PCB. The transistor terminals are then separately soldered to the PCB, and a separate clean-up step then carried out. While the foregoing soldering and cleanup steps typically assure that the connections made will be capable of carrying high current levels, which may typically reach 20 amps for a power transistor, such steps require a relatively high skill level and a relatively large amount of time to complete.

It would, therefore, be desirable to provide a more efficient method of connecting the terminals of heat-sinked, plastic-encapsulated power transistors to circuits of a printed-circuit board while assuring that the connections so made are capable of carrying high currents.

OBJECTS AND SUMMARY OF THE INVENTION

It is, accordingly, an object of the invention to provide a method of connecting the terminals of at least one heat-sinked, plastic-encapsulated power transistor to circuits of a printed-circuit board, which method substantially reduces the time and the labor costs of making such connections while assuring that such connections are capable of carrying high currents.

A further object of the invention is to carry out the foregoing method of connecting power transistor terminals with readily available parts.

In accordance with the invention, there is provided a method of connecting the terminals of at least one heat-sinked, plastic-encapsulated power transistor to circuits of a printed-circuit board. The method includes the step of adhering a main flat surface of the plastic-encapsulated power transistor to a first side of a heat sink; the transistor having a plurality of terminals projecting from one end of a transistor body in an orientation generally parallel to the main flat surface of the transistor. Further included is the step of mounting on a printed-circuit board mechanical coupling means having respective conductors with respective, terminal-receiving apertures, for receiving the terminals of the transistor; the conductors being for connection to respective circuits of the printed-circuit board; and the printed-circuit board being adapted to be located on the mentioned one side of the heat sink in an assembled position. The method includes positioning the heat sink, with the transistor mounted thereon, such that the terminals are respectively inserted into respective apertures in the mechanical coupling means. The method finally includes the steps of, in any order, (i) affixing the heat sink to a support member positioned in fixed relation to the printed-circuit board; and (ii) mechanically securing the terminals in the apertures of the mechanical coupling means, including the step of moving respective tensioning devices from a non-pressing, to a sufficiently pressing, relation against the terminals that so-pressed portions of the terminals become substantially deformed in a manner that lowers ohmic contact resistance between the terminals and the conductors of the mechanical coupling means.

In a particularly preferred embodiment of the invention, the method includes the step of bending each of terminals of the transistor along its length, for the purpose of aligning the terminals with the apertures of the mechanical coupling means.

BRIEF DESCRIPTION OF THE DRAWING FIGURES

The foregoing, and further, objects and advantages of the invention will become apparent from reading the following description of preferred embodiments of the invention, considered in conjunction with the accompanying drawing figures, in which:

FIG. 1A is a partially fragmentary, perspective view of a power transistor adhered to one side of a heat sink.

FIG. 1B is a detail view of a typical, prior art cross-section of a terminal of a plastic-encapsulated power transistor taken along the length of the terminal.

FIG. 1C is a detail view of adhesive and dielectric layers attaching the power transistor of FIG. 1A to the heat sink of that figure.

Figure 3:
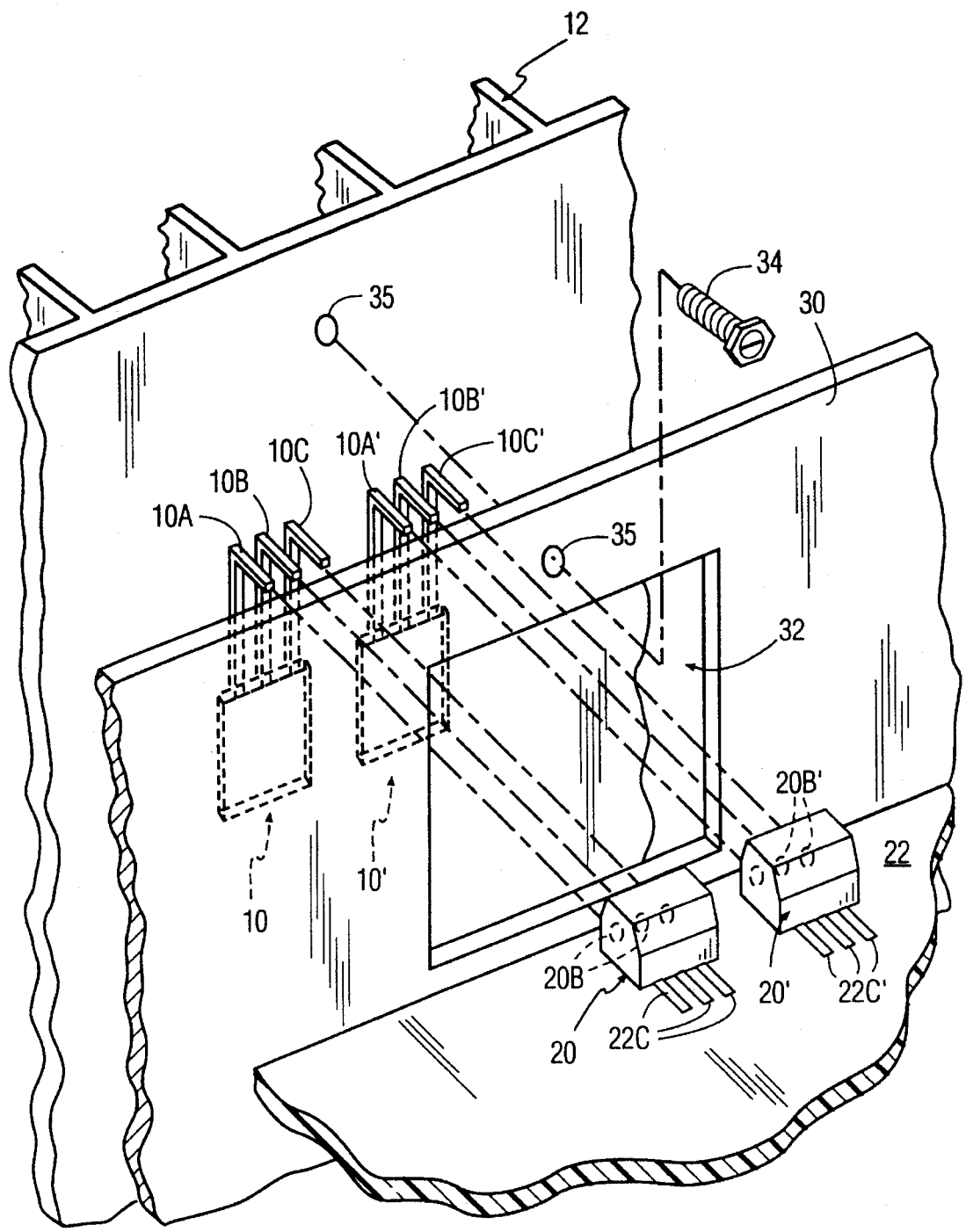

FIG. 3 is a partially fragmentary, perspective view illustrating the dual steps of (i) the terminals of a pair of power transistors being received within respective terminal-receiving apertures of a pair of mechanical coupling devices mounted on a printed-circuit board, and of (ii) the attachment of the heat sink on which the transistors are mounted to a support member that is fixed in relationship to the printed-circuit board.

Figure 4A:
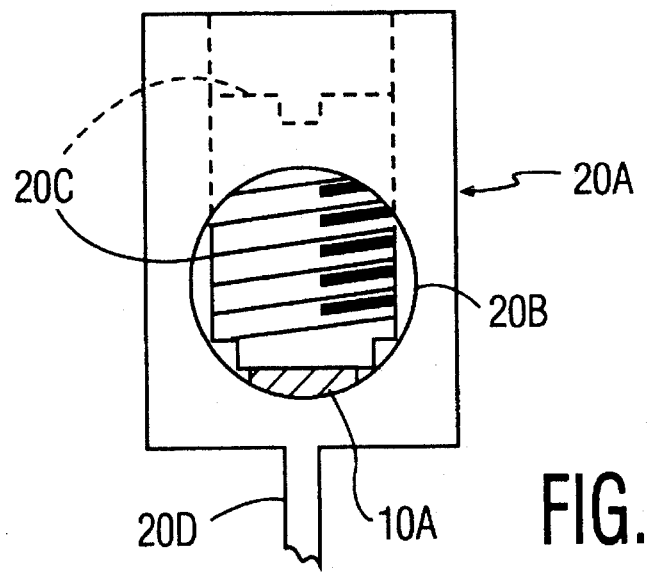

FIG. 4A is a from plan view of a conductor of a mechanical coupling device for showing a transistor terminal received within a terminal-receiving aperture becoming substantially deformed when secured in the aperture.

Figure 4B:
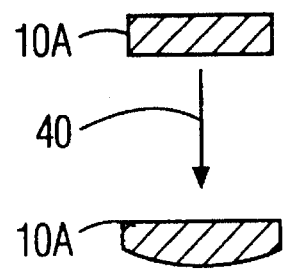

FIG. 4B is an enlarged, detail view of a cross section of a power transistor terminal for better showing the substantial deformation achieved in FIG. 4A.

Figure 4C:
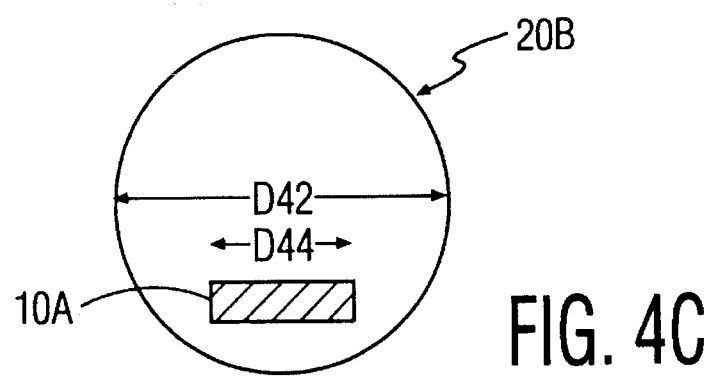

FIG. 4C is a simplified detail view of a terminal-receiving aperture of a mechanical coupling device for showing preferred dimensional relationships between a transistor terminal received within the aperture and the aperture itself.

Figure 5:
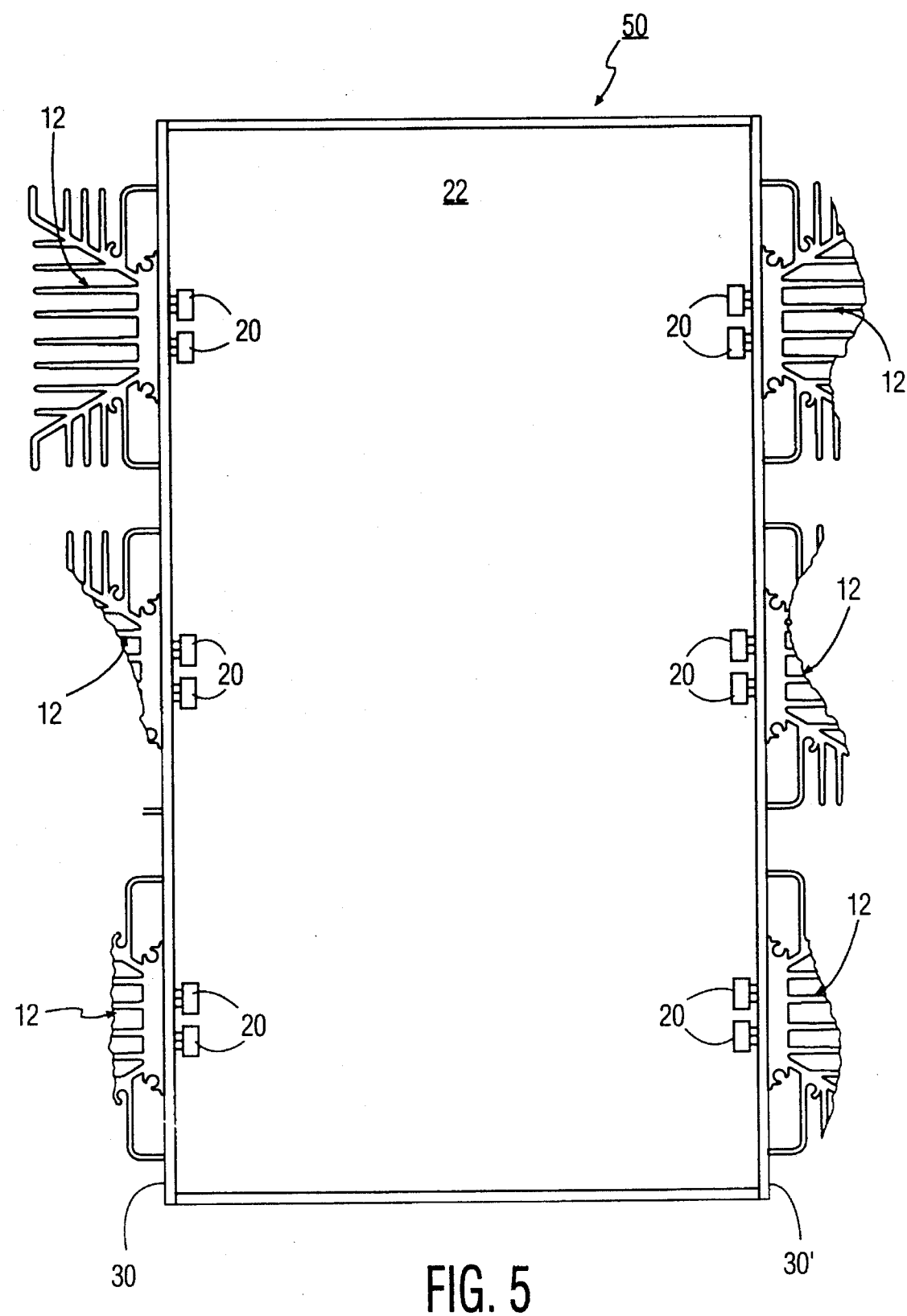

FIG. 5 is a simplified, top plan view of a power amplifier incorporating an exemplary number of six separate heat sinks, each of which has a pair of power transistors mounted on it and having terminals that are received within a respective pair of mechanical coupling devices mounted on a printed-circuit board.

DETAILED DESCRIPTION OF THE PREFERRED EMBODIMENTS

FIG. 1A illustrates the adhering of a power transistor, generally designated 10, to one side of a heat sink 12 formed of aluminum or copper, for example, only a fragment of which is shown. As is customary, heat sink 12 includes a main flat surface 12A, facing upwards in FIG. 1A, and, on an opposite side, heat-radiating fins 12B.

Power transistor 10 includes three terminals 10A, 10B and 10C, which project from the right hand shown end of a transistor body, generally designated 10D, in an orientation generally parallel to a main flat surface of transistor body 10D, such as upper surface 10E, or the lower (not numbered) surface of transistor body 10D. As shown in the cross-sectional detail view of FIG. 1B, the cross section of terminal 10A, taken at location 14 in FIG. 1A, for example, is typically rectangular, with the larger cross-sectional dimension, D1, being approximately twice the shorter cross-sectional dimension, D2. By way of example only, and not of limitation, the larger cross-sectional dimension D1 may be 1 millimeter, and the shorter cross-sectional dimension D2, 0.6 millimeters, and the terminal may be formed of tin-copper (i.e. a mixture of tin and copper). The other transistor terminals, i.e. terminals 10B and 10C, typically have approximately the same dimensions and the same composition as terminal 10A.

Transistor body 10D typically includes a metal substrate 10E of high thermal conductivity material, which typically is copper. Body 10D additionally includes plastic encapsulating material 10F, for housing the active semiconductor transistor element (not shown). High thermal conductivity metal substrate 10E is typically positioned either at the lower surface of the transistor, as viewed in FIG. 1A, or is embedded (not shown) within the transistor body, with a layer of plastic encapsulating material 10F underlying it. In FIG. 1A, a portion of high thermal conductivity metal substrate 10E is exposed at the lower surface of transistor 10, as viewed in the figure, but is recessed from various edges of the transistor body; it is shown by dashed lines where it is so recessed.

The lower, main flat surface of transistor 10 (not numbered) is adhered to surface 12A of heat sink 12 with adhering and dielectric layer 16. Details of layer 16 are shown in FIG. 1C, which shows a first, high-thermal-conductivity adhesive layer 16A applied to surface 12A of the heat sink. A dielectric layer 16B, such as mica, is then applied to first adhesive layer 16A, and a second high-thermal-conductivity adhesive layer 16C is then applied onto dielectric layer 16B. Transistor 10 is then positioned upon second adhesive layer 16C so as to become adhered to such layer.

In FIG. 1C, dielectric layer 16B may be omitted where, as viewed in FIG. 1A, a layer of plastic encapsulating material 10F underlies, and dielectrically isolates, metal substrate 10E from the lower surface of transistor 10.

With reference to FIG. 1A again, transistor 10 may be further fastened to heat sink 12 by a screw (not shown) that passes through aperture 18 in the transistor and is received within a threaded aperture (not shown) in the heat sink.

As viewed in the specific, preferred embodiment shown in FIG. 1A, the right-hand portions of terminals 10A–10C in FIG. 1A are bent approximately perpendicular to the left-hand portions of such terminals that project from the right-hand end of transistor body 10D. Such bending may be easily accomplished with a simple vise-like tool that produces bends with fairly wide tolerances, such as 0.5 millimeters.

Figure 2A:
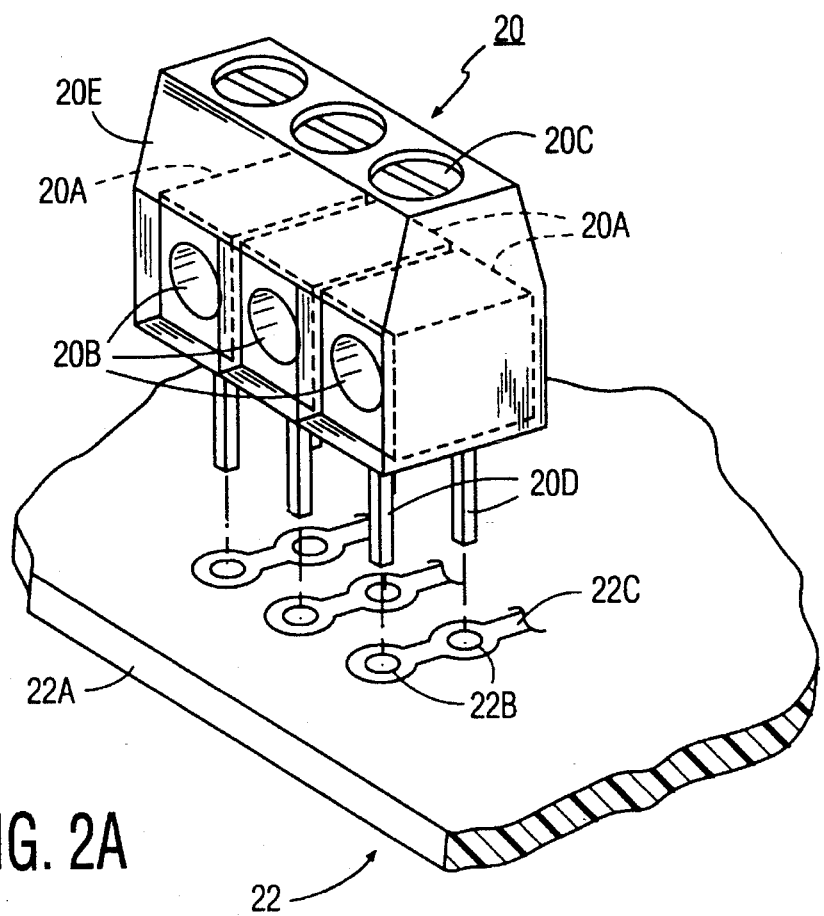
FIG. 2A is a partially fragmentary, perspective view of a mechanical coupling device being mounted onto a printed-circuit board.

FIG. 2A illustrates the mounting of a mechanical coupling device, generally designated 20, to a printed-circuit board (PCB), generally designated 22, and shown in fragmentary form. For the specific embodiment of the invention herein described, it is preferred that coupling device 20 be mounted, as shown, adjacent front shown edge 22A of PCB 22, for instance. Device 20 may include a plurality of like conductors 20A, of brass coated with nickel and then tin, for instance, each of which has a respective terminal-receiving aperture 20B (described more fully below). A screw, or other tensioning device, 20C cooperates with conductor 20A to secure a transistor terminal (not shown) within its associated aperture 20B. Each of conductors 20A preferably includes dual conductive legs 20D, which are respectively received within apertures 22B of PCB 22. Apertures 22B are electrically connected to respective circuits 22C of the PCB.

Figure 2B:
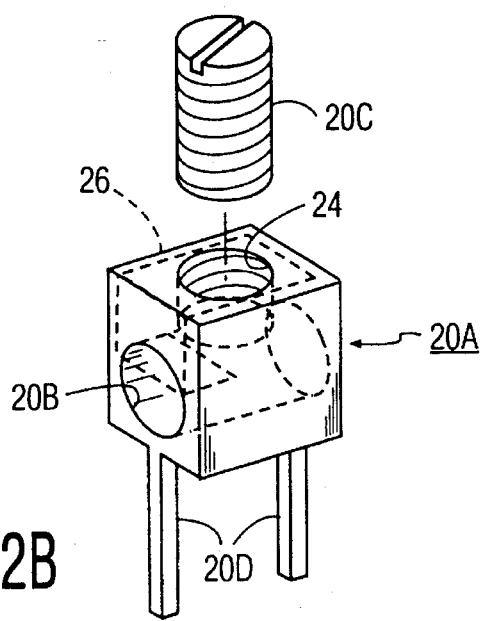
FIG. 2B is a detail view of a conductor of the mechanical coupling device of FIG. 2A, which includes an aperture for receiving a terminal of a power transistor.

Conductors 20A of device 20 are conveniently held in place relative to each other by a housing 20E of dielectric material. The detail view of FIG. 2B shows how terminal-receiving aperture 20B may comprise an elongated aperture, preferably of cylindrical shape. FIG. 2B also shows how tensioning screw 20C, with a threaded exterior, may be screwed into threaded bore 24 of conductor 20A, in a generally perpendicular orientation to cylindrical, terminal-receiving aperture 20B. Tensioning device 20C will, as described more fully below, apply tension to a terminal (not shown) received within aperture 20B, and substantially deform such terminal to achieve a lower contact resistance, to assure a high current-carrying capability (e.g. 20 amps) without destructive overheating.

It has been found desirable by the present inventor for conductor 20A to have dual legs 20D that are received within respective apertures 22B in PCB 22 (FIG. 2A). The use of dual legs, rather than a single leg, has been found by the present inventor to minimize rotation of coupling device 20 when tensioning screws 20C are being tightened sufficiently to substantially deform a terminal (not shown) received within aperture 20B.

As shown in phantom in FIG. 2B, a thin strip of conductive spring-like material 26 may be used with each conductor 20A, as is customary in a coupling device sold in the year 1993 as Type 85 or 87 under the trademark "Riacon" by RIA Electronic Inc., of Eatontown, N.J. The top-shown end of strip 26 is secured in place in coupling device 20 (FIG. 2B) by having tensioning screw 20C pass through an aperture in such top-shown end of the strip. Meanwhile, the lower-shown end of strip 26 passes into terminal-receiving aperture 20B.

The lower ends of conductor legs 20D will typically pass sufficiently through PCB 22 that they can be soldered in place from the underside of the PCB. Such soldering operation can occur simultaneously with soldering of other components (not shown) on PCB 22, such as by so-called "wave" soldering as described in the "Background of the Invention," above. Beneficially, also, the associated clean-up step for removing solder from unwanted locations of PCB 22 can be incorporated into a simultaneous clean-up step as described in the "Background of the Invention," above. Because the terminals of power transistor 10 are connected to mechanical coupling device 20 without the necessity of soldering, PCB 22, with mechanical coupling device(s) 20 already mounted thereon, may be beneficially placed within a chassis for a power amplifier, without the need for further soldering and clean-up steps to connect the transistor.

FIG. 3 shows the step of inserting terminals 10A–10C of transistor 10 (mounted on heat sink 12) into apertures 20B of mechanical coupling device 20, shown simplified. It also shows the step of affixing heat sink 12 to a support member 30 that is positioned in fixed relation to PCB 22. Support member 30 is situated generally between heat sink 12 and PCB 22, and may have a window, or opening, 32 through which transistor terminals 10A–10C are extended in order to be received within terminal-receiving apertures 20B of coupling device 20.

Referring to FIG. 3, heat sink 12, with transistor 10 mounted thereon, is positioned such that its terminals pass through window 32 and are received in respective apertures 20B of coupling device 20. The invention contemplates that there may be one or more additional power transistors, such as shown at 10' in FIG. 3, whose terminals 10A'–10C' are respectively received within apertures 20B' of a further mechanical coupling device 20'. At present, up to four additional transistors are contemplated, depending on the size of a power amplifier being assembled.

Also referring to FIG. 3, heat sink 12 is affixed to support member 30, such as with bolt 34 that passes through aperture 35 in support member 30 and is received within threaded aperture 36 in heat sink 12. Although not shown in FIG. 3, a corresponding bolt passing may likewise secure the lower part of the heat sink to support member 30. Then, either before or after (or during) the foregoing step, the respective tensioning devices (not shown in FIG. 3) of the mechanical coupling device(s) 20 are manipulated from a non-pressing, to a pressing, relation against the associated transistor terminals received in their associated terminal-receiving apertures. The foregoing step is more fully discussed, as follows, with reference to FIGS. 4A–4C. In an alternative configuration, transistors 10 and 10' may be vertically inverted 180° from the position shown in FIG. 3, and still result in the benefits of the invention described herein.

FIG. 4A illustrates the manipulation of tensioning device 20C of coupling device conductor 20A into a pressing relation against terminal 10A, for instance. Initially, when a transistor terminal, e.g. 10A, is received within aperture 20B of conductor 20A, tensioning screw 20C is substantially fully retracted from terminal-receiving aperture 20B. As tensioning screw 20C is screwed downwardly into aperture 20B, transistor terminal 10A, for instance, is pressed against the bottom of aperture 20B, shown, by way of example, as cylindrical. Tensioning device 20C preferably applies sufficient pressure to terminal 10A to substantially deform the terminal. Such deformation is schematically illustrated in FIG. 4B by an arrow 40, showing the transition from a non-deformed state of transistor terminal 10A, to a substantially deformed state of such terminal. Such substantial deformation will occur with other-than-rectangular cross-sectional shapes of a transistor terminal, but usually to a lesser degree.

The substantial deformation of the transistor terminals helps to assure a low contact resistance between the terminal and the coupling device conductor 20A. This is especially important for the power transistors described herein, which may typically carry on the order of 20 amperes of current. Without a low contact resistance, coupling device conductor 20A is susceptible to potentially damaging overheating.

FIG. 4C illustrates preferred dimensional relationships between a transistor terminal such as 10A and terminal-receiving aperture 20B. Preferably, the smallest cross-sectional radical dimension, D42, of terminal-receiving aperture 20B is greater than about twice the maximum cross-sectional dimension, D44, of transistor terminal 10A along the length of the terminal. This has been found to help minimize the contact resistance between the transistor terminal and coupling device conductor 20A (FIG. 4A), so as to prevent destructive overheating of such connections and allow high currents (e.g. 20 amps) to be conducted through the connections. At the same time, such dimensional relationship facilitates the step of inserting the transistor terminals into terminal-receiving apertures 20B, as detailed above with reference to FIG. 3.

Thus, with dimension 44 of a transistor's terminals typically being about 1 millimeter, and dimension 42 of a terminal-receiving aperture typically being about 3 millimeters, insertion of the terminals into the terminal-receiving apertures of a mechanical coupling device can be carried out reliably with simple hand manipulation, and without resort to special alignment devices.

A mechanical coupling device 20 with the foregoing aperture dimension of approximately 3 millimeters is nominally designed for 14-gauge stranded wire, which has a considerably larger diameter—i.e. about 1.8 millimeters—than the exemplary 1-millimeter dimension 44 of a transistor terminal mentioned above.

Dimension D44 of terminal 10A, however, can be considerably larger than the foregoing, preferred dimension (with respect to dimension D42 of aperture 20B) and still realize substantial benefits of the invention, although to a lesser degree. Moreover, substantial benefits of the invention will be realized where terminal-receiving aperture 20B is configured other than as the preferred, cylindrical shape illustrated herein, or where the cross-sectional shape of the terminals of a power transistor along their length is other than rectangular as shown herein.

FIG. 5 schematically shows a simplified top plan view of a power amplifier 50 employing an exemplary number of six heat sinks 12; amplifiers employing fewer or more heat sinks, such as four, are contemplated. In the manner described above, each heat sink is associated with two power transistors (not shown) respectively connected to two mechanical coupling devices 20 mounted on PCB 22. Each heat sink 12 and the respective transistors (not shown) mounted thereon comprises a modular unit. Each such modular unit can be easily removed from a respective support member 30 or 30' and respective mechanical coupling devices 20, simply using the reverse of the procedure described above in connection with FIG. 3. This beneficially permits the transistors so removed to be tested in isolation from amplifier 50.

The time for assembling a power amplifier such as shown in FIG. 5 is considerably reduced by connecting the power transistor terminals to the PCB in the manner taught herein. A time savings alone of about one to two minutes for each transistor is realized, and the need for highly skilled labor to conduct the solder and clean-up steps of the prior art is eliminated.

From the foregoing, it will be appreciated that the invention provides a method of connecting the terminals of at least one heat-sinked, plastic-encapsulated power transistor to circuits of a printed-circuit board, which method substantially reduces the time and labor costs of making such connections while assuring that such connections are capable of carrying high currents. The method can, further, be carried out with readily available parts. In preferred embodiments of the invention, wherein terminal-receiving apertures of mechanical coupling devices have a smallest radial dimension greater than about twice the largest cross-sectional dimension of the terminals along their length, connections can be made without resort to elaborate alignment devices or highly skilled labor.

While the invention has been described with respect to specific embodiments by way of illustration, many modifications and changes will occur to those skilled in the art. It is therefore, to be understood that the appended claims are intended to cover all such modifications and changes as fall within the true spirit and scope of the invention.

What is claimed is:

1. Method of connecting the terminals of at least one heat-sinked, plastic-encapsulated power transistor to circuits of a printed-circuit board, comprising the steps of:

(a) adhering a main flat surface of the plastic-encapsulated power transistor to a first side of a heat sink; said transistor having a plurality of terminals projecting from one end of a transistor body in an orientation generally parallel to said main flat surface of the transistor and carrying power transistor-level currents during normal operation;

(b) mounting on a printed-circuit board mechanical coupling means having conductors with terminal-receiving apertures, for receiving and being connected to said terminals of said transistor with a sufficiently low contact resistance to permit conduction through the resulting connections of power transistor-level current; said conductors being for connection to circuits of said printed-circuit board; said printed-circuit board being adapted to be located on said first side of said heat sink in an assembled position;

(c) positioning said heat sink, with said transistor mounted thereon, such that each of said terminals is inserted into a different aperture in said mechanical coupling means;

(d) affixing said heat sink to a support member that is in fixed relation to said printed-circuit board; and (e) mechanically securing said terminals in said apertures of said mechanical coupling means, including the step of moving tensioning devices from a non-pressing, to a sufficiently pressing, relation against said terminals that so-pressed portions of said terminals become substantially deformed in a manner that assures an adequately low ohmic contact resistance between said terminals and said conductors of said mechanical coupling means with respect to power transistor-level current.

2. The method of claim 1, wherein:

(a) said terminals each have a cross section orthogonal to a longitudinal axis of the terminal; and (b) said step (c) of positioning includes inserting said terminals into said apertures each having a dimension in the direction of a largest dimension of a mentioned cross section of an associated terminal that is greater than about twice said largest dimension 3. The method of claim 1, wherein:

(a) said terminals each have a cross section orthogonal to a longitudinal axis of the terminal; and (a) said cross section of said terminals is generally rectangular.

4. The method of claim 3, wherein the ratio of the longer, to the shorter, dimension of said rectangular cross-section is approximately 2 to 1.

5. The method of claim 1, further comprising the steps of repeating steps (a) and (b) for a further power transistor associated with the mentioned heat sink, and performing steps (c) and (d) for the first-mentioned transistor and said further power transistor.

6. The method of claim 1, wherein said step (b) of mounting includes inserting at least dual legs of each conductor of said mechanical coupling means through leg-receiving apertures in said printed-circuit board.

7. The method of claim 1, wherein said step (b) of mounting includes mounting said mechanical coupling means having conductors whose terminal-receiving apertures are rounded in proximity of where said terminals are positioned in an assembled position.

8. The method of claim 1, wherein said step (a) of adhering comprises adhering a transistor including a metal substrate to said first side of said heat sink.

9. The method of claim 1, further comprising repeating steps (a) through (d) for at least one further power transistor associated with a further heat sink, so as to facilitate individual heat sink and transistor removal for purposes of testing said removed transistor in isolation.

10. The method of claim 9, wherein the mentioned steps are repeated at least twice.

11. Method of connecting the terminals of at least one heat-sinked, plastic-encapsulated power transistor to circuits of a printed-circuit board, comprising the steps of:

(a) adhering a main flat surface of the plastic-encapsulated power transistor to a first side of a heat sink; said transistor having a plurality of terminals projecting from one end of a transistor body in an orientation generally parallel to said main flat surface of the transistor and carrying power transistor-level currents during normal operation;

(b) mounting on, and adjacent an edge, of a printed-circuit board mechanical coupling means having conductors with terminal-receiving apertures, for receiving and being connected to said terminals of said transistor with a sufficiently low contact resistance to permit conduction through the resulting connections of power transistor-level current; a longitudinal axis of each of said terminal-receiving apertures being oriented generally parallel to a major surface of said printed-circuit board; said conductors being for connection to circuits of said printed-circuit board; said printed-circuit board being adapted to be located on said first side of said heat sink in an assembled position;

(c) forming an approximately perpendicular bend in each of said terminals along their length such that the ends of said terminals distal from said transistor body project away from said body at an approximate right angle to said main flat surface of the transistor;

(d) positioning said heat sink, with said transistor mounted thereon, such that said distal ends of said terminals are each inserted into a different aperture in said mechanical coupling means;

(e) affixing said heat sink to a support member that is in fixed relation to said printed-circuit board; and (f) mechanically securing said terminals in said apertures of said mechanical coupling means, including the step of moving tensioning devices from a non-pressing, to a sufficiently pressing, relation against said terminals that so-pressed portions of said terminals become substantially deformed in a manner that assures an adequately low ohmic contact resistance between said terminals and said conductors of said mechanical coupling means with respect to power transistor-level currents.

12. The method of claim 11, wherein:

(a) said terminals each have a cross section orthogonal to a longitudinal axis of the terminal; and (b) said step (c) of positioning includes inserting said terminals into said apertures each having a dimension in the direction of a largest dimension of a mentioned cross section of an associated terminal that is greater than about twice said largest dimension.

13. The method of claim 11, wherein said step of moving said tensioning devices includes rotating tensioning screws into a pressing relation against said terminals.

14. The method of claim 11, wherein said step (b) of mounting includes inserting at least dual legs of each conductor of said mechanical coupling means through leg-receiving apertures in said printed-circuit board.

15. The method of claim 11, wherein:

(a) said terminals each have a cross section orthogonal to a longitudinal axis of the terminal; and (b) said cross section of said terminals is generally rectangular.

16. The method of claim 15, wherein the ratio of the longer, to the shorter, dimension of said rectangular cross-section is approximately 2 to 1.

17. The method of claim 11, wherein said step (a) of adhering comprises adhering a transistor including a metal substrate to said first side of said heat sink.

18. The method of claim 1, wherein said step of moving said tensioning devices includes rotating tensioning screws into a pressing relation against said terminals.

* * * * *